United States Patent
Chiu et al.

(10) Patent No.: US 9,473,147 B2
(45) Date of Patent: Oct. 18, 2016

(54) FREQUENCY DIVIDING APPARATUS AND RELATED METHOD

(71) Applicant: MEDIATEK INC., Hsin-Chu (TW)

(72) Inventors: Wei-Hao Chiu, Taichung (TW);
Ang-Sheng Lin, Kaohsiung (TW);
Kun-Yin Wang, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 71 days.

(21) Appl. No.: 14/636,190

(22) Filed: Mar. 3, 2015

(65) Prior Publication Data
US 2016/0261273 A1    Sep. 8, 2016

(51) Int. Cl.
*H03K 23/66* (2006.01)
*H03K 21/38* (2006.01)

(52) U.S. Cl.
CPC .......... *H03K 23/667* (2013.01); *H03K 21/38* (2013.01)

(58) Field of Classification Search
CPC .................. H03K 21/38; H03K 23/667
See application file for complete search history.

(56) References Cited

U.S. PATENT DOCUMENTS

| | | | | |
|---|---|---|---|---|
| 6,614,870 B1 * | 9/2003 | Miller | ............. | H03K 23/667 377/48 |
| 7,233,181 B2 * | 6/2007 | Osako | ............. | H03K 23/667 327/115 |
| 7,248,665 B2 * | 7/2007 | Shi | ............. | H03K 23/667 327/115 |
| 7,719,326 B2 * | 5/2010 | Casagrande | ......... | H03K 23/667 327/115 |
| 8,675,810 B2 * | 3/2014 | Martin | ............. | H03K 23/667 377/47 |
| 9,118,333 B1 * | 8/2015 | Mika | ............. | H03K 23/70 |

* cited by examiner

*Primary Examiner* — Patrick O'Neill
(74) *Attorney, Agent, or Firm* — Winston Hsu; Scott Margo

(57) ABSTRACT

A frequency dividing apparatus includes: a plurality of latching devices arranged to selectively generate an output signal having a first oscillating frequency or a second oscillating frequency different from the first oscillating frequency according to an input clock signal and a first reset signal; and a controlling device arranged to generate the first reset signal at least according to a programming input signal; wherein the first reset signal is arranged to reset a first latching device in the plurality of latching devices to make the plurality of latching devices to generate the output signal having the second oscillating frequency.

16 Claims, 8 Drawing Sheets

FREQUENCY DIVIDING APPARATUS AND RELATED METHOD

BACKGROUND

The present invention relates to a frequency dividing apparatus and the related method, and more particularly to a high speed dual-modulus prescaler and the related method.

A frequency divider is commonly used for converting a high frequency clock signal into a low frequency clock signal. For example, a frequency divider may be used in a feedback loop of a frequency synthesizer. A conventional frequency divider comprises a plurality of cascaded dual-modulus prescalers, and each dual-modulus prescaler has two different frequency divisors. By individually controlling each of the plurality of cascaded dual-modulus prescalers to operate under one of the divisors, the frequency divider is capable of dividing a high frequency clock signal into a low frequency clock signal by an adjustable total divisor. However, in the modern semiconductor manufacturing technology, when a low supply voltage is applied to the frequency divider, some of the dual-modulus prescalers may operate abnormally. More specifically, for those dual-modulus prescalers in the front-end of the frequency divider, the dual-modulus prescalers deal with clock signal having higher frequency than those in the back-end of the frequency divider. The front-end dual-modulus prescalers may operate abnormally in the low supply voltage and high frequency environment due to the critical mode timing control. For example, when a control signal triggers the dual-modulus prescaler to switch from a first divisor into a second divisor, the control signal may not timely switch the dual-modulus prescaler under the low supply voltage and high frequency environment. As a result, the dual-modulus prescaler may still use the first divisor to divide the input clock signal after the triggering of the control signal. Therefore, how to increase the operating speed of a dual-modulus prescaler under the low supply voltage and high frequency environment is an urgent problem in the field of frequency divider.

SUMMARY

One of the objectives of the present embodiment is to provide a high speed dual-modulus prescaler and the related method.

According to a first embodiment of the present invention, a frequency dividing apparatus is disclosed. The frequency dividing apparatus comprises a plurality of latching devices and a controlling device. The plurality of latching devices are arranged to selectively generate an output signal having a first oscillating frequency or a second oscillating frequency different from the first oscillating frequency according to an input clock signal and a first reset signal. The controlling device is arranged to generate the first reset signal at least according to a programming input signal, wherein the first reset signal is arranged to reset a first latching device in the plurality of latching devices to make the plurality of latching devices to generate the output signal having the second oscillating frequency.

According to a second embodiment of the present invention, a frequency dividing method is disclosed. The frequency dividing method comprises: using a plurality of latching devices to selectively generate an output signal having a first oscillating frequency or a second oscillating frequency different from the first oscillating frequency according to an input clock signal and a first reset signal; generating the first reset signal at least according to a programming input signal; and using the first reset signal to reset a first latching device in the plurality of latching devices to make the plurality of latching devices to generate the output signal having the second oscillating frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
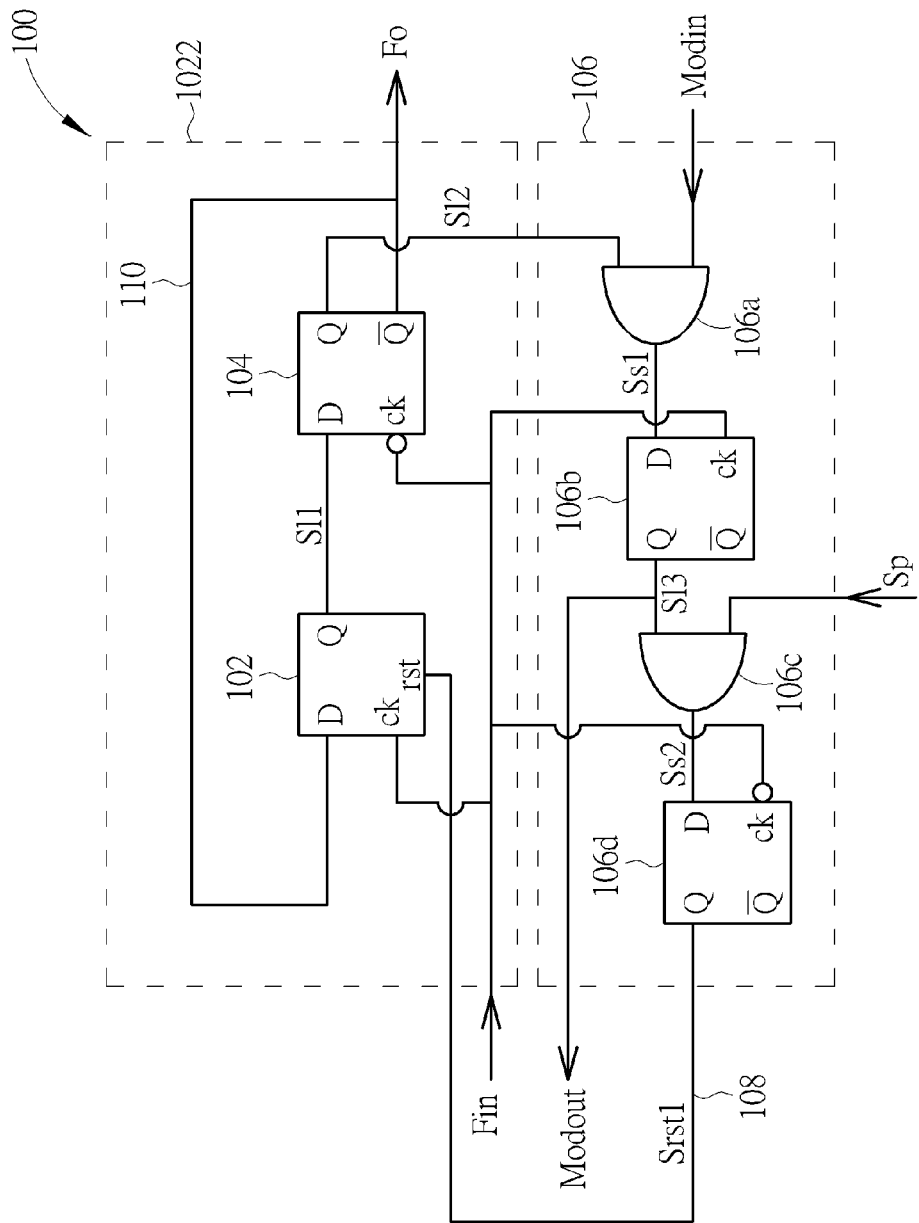
FIG. 1 is a diagram illustrating a frequency dividing apparatus according to a first embodiment of the present invention.

Please refer to FIG. 1, which is a diagram illustrating a frequency dividing apparatus 100 according to a first embodiment of the present invention. The frequency dividing apparatus 100 may be a dual-modulus prescaler. The frequency dividing apparatus 100 comprises a plurality of latching devices, i.e. a first latching device 102 and a second latching device 104, arranged to selectively generate an output signal Fo having a first oscillating frequency f1 or a second oscillating frequency f2 different from the first oscillating frequency f1 according to an input clock signal Fin and a first reset signal Srst1. Therefore, the first latching device 102 in combination with the second latching device 104 can be regarded as a prescaler logic 1022. The controlling device 106 is arranged to generate the first reset signal Srst1 according to a programming input signal Sp, the input clock signal Fin, a mode control signal Modin, and the output signal Fo. In this embodiment, the frequency dividing apparatus 100 has two divisors, one divisor is two and the other divisor is three. When the frequency dividing apparatus 100 divides the input clock signal Fin by two, the output signal Fo having the first oscillating frequency f1 is outputted. When the frequency dividing apparatus 100 divides the input clock signal Fin by three, the output signal Fo having the second oscillating frequency f2 is outputted. It is noted that the divisors are not the limitations of the present invention. Moreover, the first oscillating frequency f1 and the second oscillating frequency f2 are depended on the frequency of the input clock signal Fin.

According to the embodiment, the first reset signal Srst1 is arranged to reset the first latching device 102 to make the prescaler logic 1022 to generate the output signal Fo having the second oscillating frequency f2. More specifically, when the first reset signal Srst1 is a high voltage level Vdd, the first reset signal Srst1 resets the first latching device 102 to make the prescaler logic 1022 to divide the input clock signal Fin by three. When the first reset signal Srst1 is a low voltage level Vgnd, the first reset signal Srst1 does not reset the first latching device 102 to make the prescaler logic 1022 to divide the input clock signal Fin by two.

In addition, the first latching device 102 has a clock terminal ck receiving the input clock signal Fin, a reset terminal rst receiving the first reset signal Srst1, a data input terminal D receiving the output signal Fo, and a data output terminal Q outputting a first latching signal S11. The second latching device 104 has a clock terminal ck receiving an inverse input clock signal of the input clock signal Fin, a data input terminal D receiving the first latching signal S11, a first data output terminal Q outputting a second latching signal S12, and a second data output terminal Q_bar outputting the output signal Fo.

The controlling device 106 comprises a first AND gate 106a, a third latching device 106b, a second AND gate 106c, and a fourth latching device 106d. The first AND gate 106a has a first input terminal receiving the second latching signal S12, a second input terminal receiving the mode control signal Modin, which is received from to the next dual-modulus prescaler, and an output terminal outputting a first logical signal Ss1. The third latching device 106b has a clock terminal ck receiving the input clock signal Fin, a data input terminal D receiving the first logical signal Ss1, and a first data output terminal Q outputting a third latching signal S13. The third latching signal S13 can be regarded as a mode output signal Modout, which is provided to the previous dual-modulus prescaler. The second AND gate 106c has a first input terminal receiving the third latching signal S13, a second input terminal receiving the programming input signal Sp, and an output terminal outputting a second logical signal Ss2. The fourth latching device 106d has a clock terminal ck receiving the inverse input clock signal of the input clock signal Fin, a data input terminal D receiving the second logical signal Ss2, and a first data output terminal Q outputting the first reset signal Srst1.

According to the embodiment, a conducting path 108 is arranged to directly connect between the reset terminal rst of the first latching device 102 and the first data output terminal Q of the fourth latching device 106d for conducting the first reset signal Srst1 to the first latching device 102. Accordingly, once the first reset signal Srst1 is generated, the first reset signal Srst1 can immediately reset the first latching device 102 without passing through any logical stage. Therefore, the arrangement of the conducting path 108 can shorten the transmission time of the first reset signal Srst1. Moreover, another conducting path 110 is arranged to directly connect between the data input terminal D of the first latching device 102 and the second data output terminal Q_bar of the second latching device 104 to shorten the transmission time of the output signal Fo transmitted from the second data output terminal Q_bar of the second latching device 104 to the data input terminal D of the first latching device 102.

Figure 2:
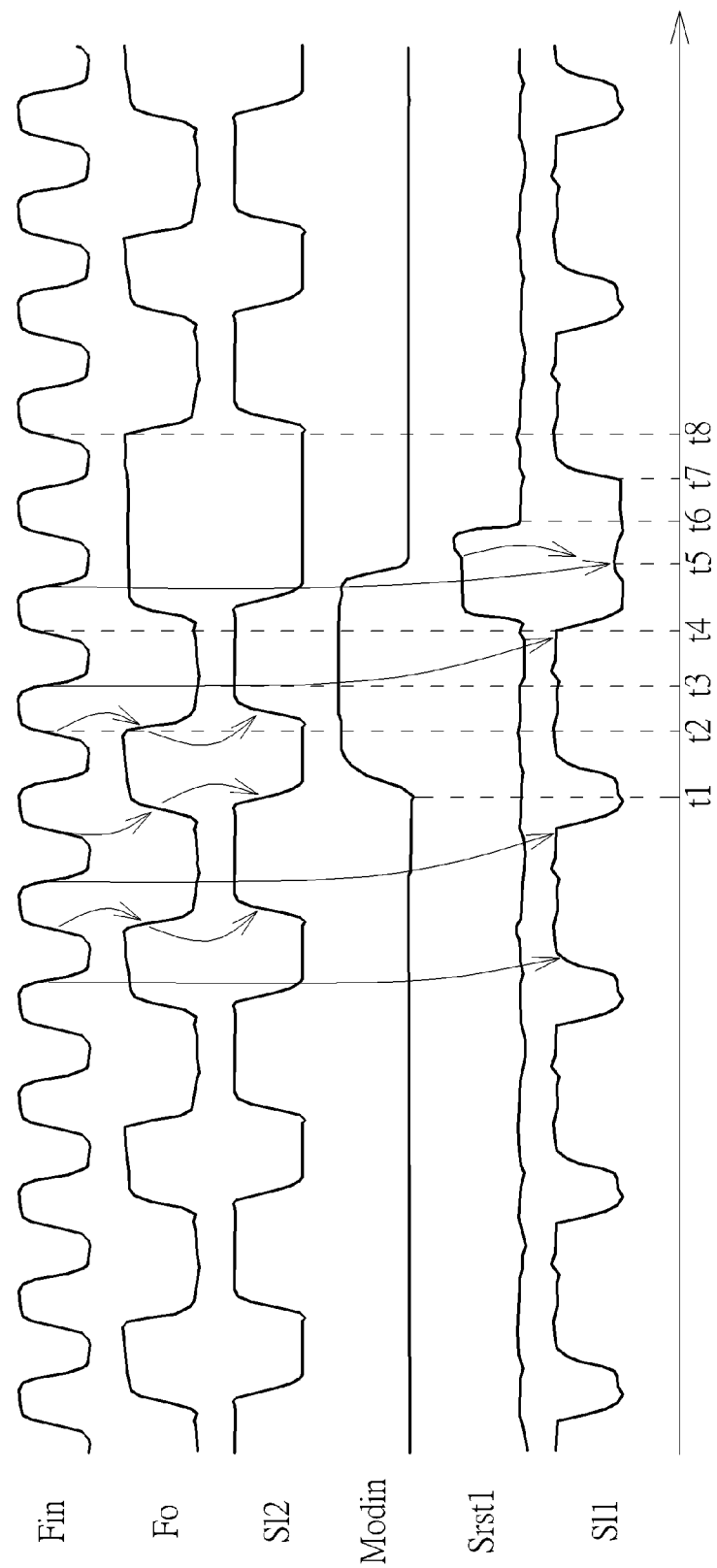
FIG. 2 is a timing diagram illustrating an input clock signal, an output signal, a second latching signal, a mode control signal, a first reset signal, and a first latching signal according to an embodiment of the present invention.
Figure 7:
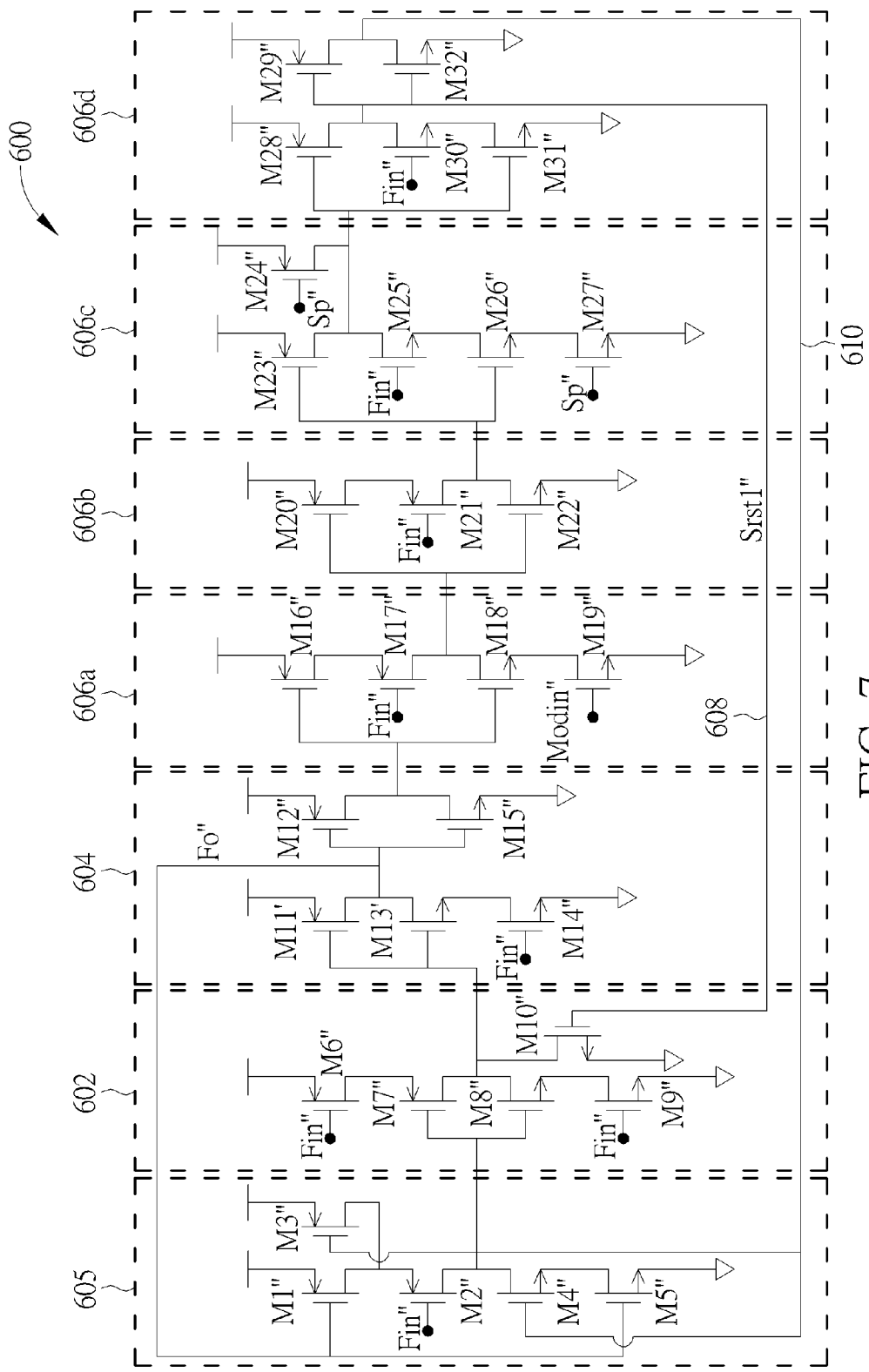
FIG. 7 is a schematic diagram illustrating a frequency dividing apparatus of FIG. 6 according to an embodiment of the present invention.

More specifically, please refer to FIG. 2, which is a timing diagram illustrating the input clock signal Fin, the output signal Fo, the second latching signal S12 (which is the inverse of the output signal Fo), the mode control signal Modin, the first reset signal Srst1, and the first latching signal S11 according to an embodiment of the present invention. It is assumed that the programming input signal Sp is in the high voltage level Vdd in this embodiment. Before the time t1, the voltage levels of the mode control signal Modin and the first reset signal Srst1 are the low voltage level Vgnd, thus the frequency dividing apparatus 100 divides the frequency of the input clock signal Fin by two. At time t1, the frequency dividing apparatus 100 receives the high voltage level Vdd of the mode control signal Modin from the next frequency dividing apparatus (not shown), meaning that the frequency dividing apparatus 100 needs to divide the frequency of the input clock signal Fin by three in the next period of input clock signal Fin. At time t2, the rising edge of the input clock signal Fin controls the second latching device 104 to output the low voltage level Vgnd of the output signal Fo and to output the high voltage level Vdd of the second latching signal S12. Meanwhile, at time t2, the rising edge of the input clock signal Fin controls the first latching device 102 to read the low voltage level Vgnd of the output signal Fo. Then, at time t3, the falling edge of the input clock signal Fin controls the first latching device 102 to change the voltage level of the first latching signal S11 into the low voltage level Vgnd from the high voltage level Vdd. After a delay time td, the voltage level of the first latching signal S11 is changed to the low voltage level Vgnd from the high voltage level Vdd at time t4. Meanwhile, at time t3, the falling edge of the input clock signal Fin controls the fourth latching device 106d to read the high voltage level Vdd of the second logical signal Ss2 (not shown in FIG. 2). Then, at time t4, the rising edge of the input clock signal Fin controls the fourth latching device 106d to output the high voltage level Vdd of the first reset signal Srst1. Then, the first latching device 102 is reset by the high voltage level Vdd of the first reset signal Srst1 in the time interval from t4 to t6. Accordingly, the falling edge of the input clock signal Fin at time t5 does not change the voltage level of the first latching signal S11 to the high voltage level Vdd from the low voltage level Vgnd. In other words, the first latching signal S11 is kept at low voltage level Vgnd for another one period of the input clock signal Fin until time t7 as shown in FIG. 7. When the first latching signal S11 is kept at low voltage level Vgnd until time t7, the voltage level of the output signal Fo as well as the second latching signal S12 is also kept intact for another one period of the input clock signal Fin until time t8. Accordingly, the frequency dividing apparatus 100 divides the frequency of the input clock signal Fin by three from the time t2 to the time t8.

It is noted that, to successfully divide the frequency of the input clock signal Fin by three from the time t2 to the time t8, the high voltage level Vdd of the first reset signal Srst1 should be timely reset the first latching device 102 otherwise the first latching device 102 will outputs the high voltage level Vdd at time t5. More specifically, when the voltage level of the first reset signal Srst1 is changed to the high voltage level Vdd at time t4, the voltage level of the output signal Fo also changes to the high voltage level Vdd at about time t4. If the high voltage level Vdd of the first reset signal Srst1 is not transmitted to the first latching device 102 to reset the first latching device 102 before time t5, the falling edge at the time t5 may control the first latching device 102 to output the high voltage level Vdd. According to the embodiment, the conducting path 108 shortens the transmission time of the first reset signal Srst1 such that the high voltage level Vdd of the first reset signal Srst1 can timely reset the first latching device 102 as shown in FIG. 2.

Figure 3:
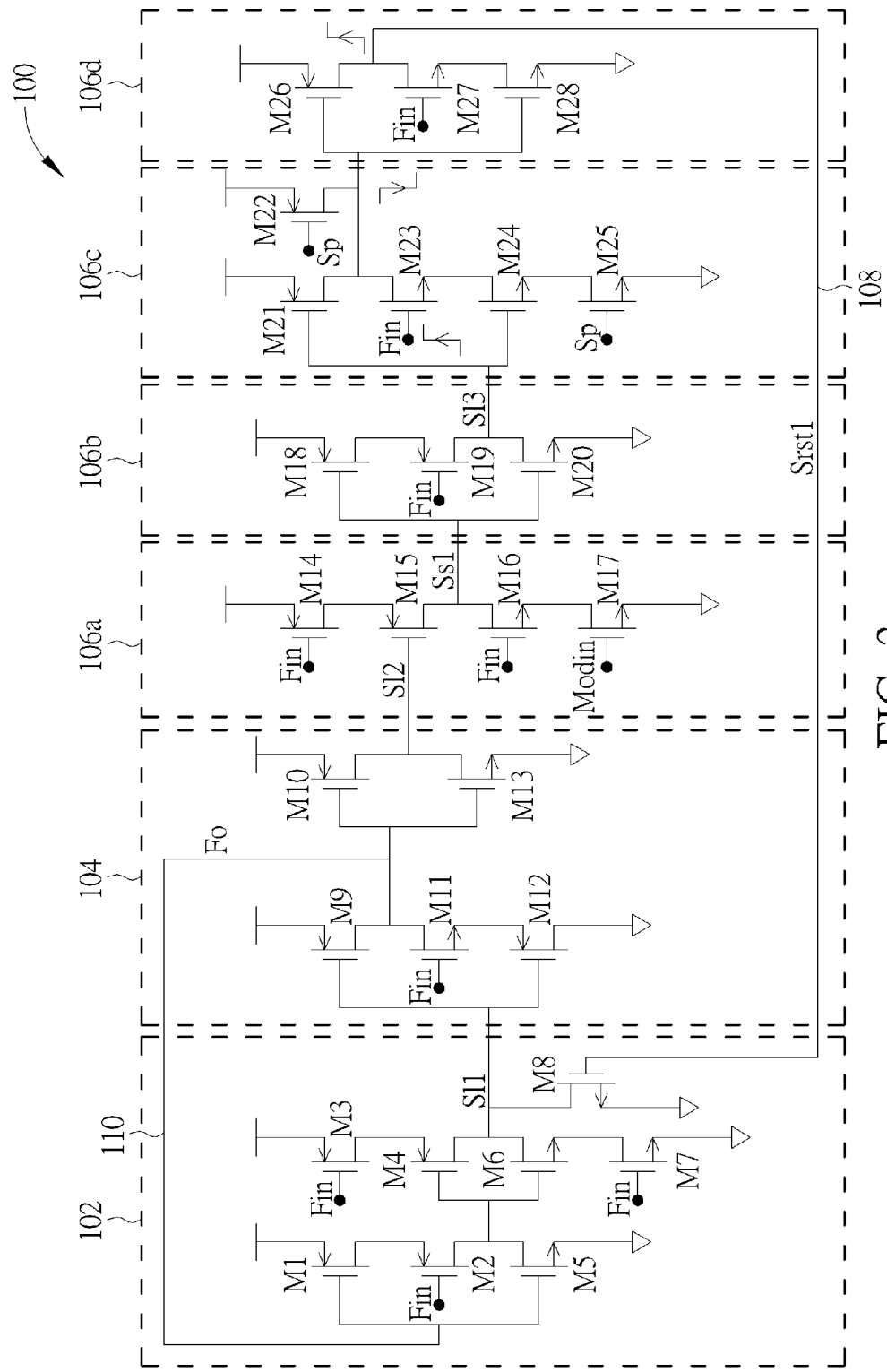
FIG. 3 is a schematic diagram illustrating a frequency dividing apparatus according to an embodiment of the present invention.

Please refer to FIG. 3, which is a schematic diagram illustrating the frequency dividing apparatus 100 according to an embodiment of the present invention. The frequency dividing apparatus 100 is a true single phase clock (TSPC) circuit. The first latching device 102 comprises four P-type transistors M1, M2, M3, M4, and four N-type transistors M5, M6, M7, M8. The gates of P-type transistor M1 and the N-type transistor M5 receive the output signal Fo. The gates of P-type transistors M2, M3, and the N-type transistor M7 receive the input clock signal Fin. The gate of the N-type transistor M8 receives the first reset signal Srst1. The first latching signal S11 is outputted at the drain of the P-type transistor M4.

The second latching device 104 comprises two P-type transistors M9, M10, and three N-type transistors M11, M12, M13. The gates of the P-type transistor M9 and the N-type transistor M12 receive the first latching signal S11. The gate of N-type transistor M11 receives the input clock signal Fin. The output signal Fo is outputted at the drain of P-type transistor M9. The second latching signal S12 is outputted at the drain of the P-type transistor M10.

The first AND gate 106a comprises two P-type transistors M14, M15, and two N-type transistors M16, M17. The gate of the P-type transistor M15 receives the second latching signal S12. The gates of the P-type transistor M14 and the N-type transistor M16 receive the input clock signal Fin. The gate of the N-type transistor M16 receives the mode control signal Modin. The first logical signal Ss1 is outputted at the drain of the P-type transistor M15.

The third latching device 106b comprises two P-type transistors M18, M19, and one N-type transistor M20. The gates of P-type transistor M18 and N-type transistor M20 receive the first logical signal Ss1. The gate of P-type transistor M19 receives the input clock signal Fin. The third latching signal S13 is outputted at the drain of the P-type transistor M19.

The second AND gate 106c comprises two P-type transistors M21, M22, and three N-type transistors M23, M24, M25. The gates of P-type transistor M21 and N-type transistor M24 receive the third latching signal S13. The gate of N-type transistor M23 receives the input clock signal Fin. The gates P-type transistor M22 and N-type transistor M25 receive the programming input signal Sp. The second logical signal Ss2 is outputted at the drain of the P-type transistor M21.

The fourth latching device 106d comprises one P-type transistor M26, and two N-type transistors M27, M28. The gate of the P-type transistor M26 and the N-type transistor M28 receive the second logical signal Ss2. The gate of N-type transistor M27 receives the input clock signal Fin. The first reset signal Srst1 is outputted at the drain of P-type transistor M26.

It is noted that the connectivity of the circuit elements in the frequency dividing apparatus 100 is shown in FIG. 3, thus the detailed description is omitted here for brevity.

According to FIG. 3, it is assumed that the voltage levels of the third latching signal S13 and the programming input signal Sp are the high voltage level Vdd. When the voltage at the gate of the N-type transistor M23 is changed to high voltage level Vdd from the low voltage level Vgnd, i.e. the rising edge of the input clock signal Fin, then the voltage (i.e. the second logical signal Ss2) at the drain of the P-type transistor M21 is discharged to the low voltage level Vgnd from the high voltage level Vdd. Then, the voltage (i.e. the first reset signal Srst1) at the drain of the P-type transistor M26 is charged to the high voltage level Vdd from the low voltage level Vgnd. The high voltage level Vdd of the first reset signal Srst1 will directly discharge the voltage at the drain of the P-type transistor M4 to the low voltage level Vgnd from the high voltage level Vdd via the conducting path 108, i.e. to reset the first latching device 102. In other words, the rising edge at the gate of the N-type transistor M23 only passes two logical stages (i.e. the second AND gate 106c and the fourth latching device 106d) to reset the first latching device 102. Therefore, the conducting path 108 directly connected between the fourth latching device 106d and the first latching device 102 shortens the transmission time of the first reset signal Srst1 such that the high voltage level Vdd of the first reset signal Srst1 can timely reset the first latching device 102.

It should be noted that the above mentioned high voltage level Vdd and the low voltage level Vgnd may not be the fixed voltage levels. The high voltage level Vdd and the low voltage level Vgnd may deviate from their predetermined voltage levels due to the voltage drop between the drain and the source of a transistor.

Figure 4:
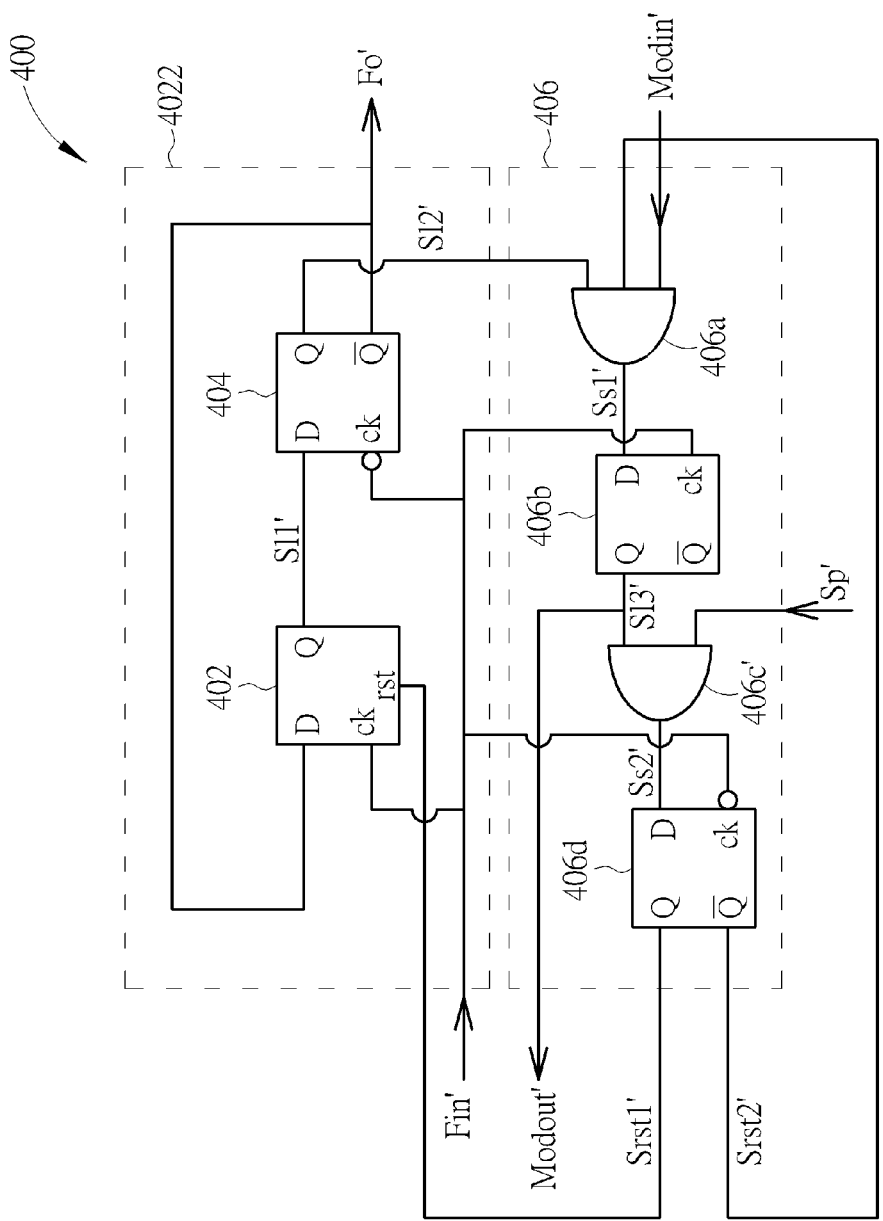
FIG. 4 is a diagram illustrating a frequency dividing apparatus according to a second embodiment of the present invention.

Please refer to FIG. 4, which is a diagram illustrating a frequency dividing apparatus 400 according to a second embodiment of the present invention. The frequency dividing apparatus 400 may be a dual-modulus prescaler. The frequency dividing apparatus 400 comprises a plurality of latching devices, i.e. a first latching device 402 and a second latching device 404, arranged to selectively generate an output signal Fo' having a first oscillating frequency f1' or a second oscillating frequency f2' different from the first oscillating frequency f1' according to an input clock signal Fin' and a first reset signal Srst1'. The first latching device 402 in combination with the second latching device 404 can be regarded as a prescaler logic 4022. The controlling device 406 is arranged to generate the first reset signal Srst1' and a second reset signal Srst2' according to a programming input signal Sp', the input clock signal Fin', a mode control signal Modin', and the output signal Fo'. Similar to the first embodiment, the frequency dividing apparatus 400 has two divisors, one divisor is two and the other divisor is three.

According to this embodiment, the first reset signal Srst1' is arranged to reset the first latching device 102' to make the prescaler logic 4022 to generate the output signal Fo' having the second oscillating frequency f2'. Similar to the first embodiment, when the first reset signal Srst1' is a high voltage level Vdd', the first reset signal Srst1' resets the first latching device 402 to make the prescaler logic 4022 to divide the input clock signal Fin' by three. When the first reset signal Srst1' is a low voltage level Vgnd', the first reset signal Srst1' does not reset the first latching device 402 to make the prescaler logic 4022 to divide the input clock signal Fin' by two.

On the other hand, the second reset signal Srst2' is arranged to reset the controlling device 406, and the second reset signal Srst2' is an inverse signal of the first reset signal Srst1'. Therefore, when the second reset signal Srst2' is the low voltage level Vgnd', the second reset signal Srst2' resets the controlling device 406. When the second reset signal Srst2' is the high voltage level Vdd', the second reset signal Srst2' does not reset the controlling device 406.

The prescaler logic 4022 is similar to the prescaler logic 1022 of the frequency dividing apparatus 100. Therefore, the detailed description of the prescaler logic 4022 is omitted here for brevity.

For the controlling device 406, the controlling device 406 also comprises a first AND gate 406a, a third latching device 406b, a second AND gate 406c, and a fourth latching device 406d. The connectivity of the controlling device 406 is similar to the connectivity of the controlling device 106 except that another conducting path 406e is directly connected between the fourth latching device 406d and the first AND gate 406a for transmitting the second reset signal Srst2'. More specifically, in this embodiment, the fourth latching device 406d further has a clock terminal ck receiving the inverse input clock signal of the input clock signal Fin', a data input terminal D receiving the second logical signal Ss2', a first data output terminal Q outputting the first reset signal Srst1', and a second data output terminal Q_bar outputting the second reset signal Srst2'. The first AND gate 406a has a first input terminal receiving the second latching signal S12', a second input terminal receiving the mode control signal Modin', which is received from to the next dual-modulus prescaler, a third input terminal receiving the second reset signal Srst2', and an output terminal outputting a first logical signal Ss1'.

Accordingly, in this embodiment, the first conducting path 408 is arranged to directly connect between the reset terminal rst of the first latching device 402 and the first data output terminal Q of the fourth latching device 406d for conducting the first reset signal Srst1' to the first latching device 402, and the second conducting path 406e is arranged to directly connect between the second output terminal Q_bar of the fourth latching device 406d and the third input terminal of the first AND gate 406a for conducting the second reset signal Srst2' to the first AND gate 406a.

Therefore, once the first reset signal Srst1' and the second reset signal Srst2' are generated, the first reset signal Srst1' and the second reset signal Srst2' can immediately reset the first latching device 402 and the first AND gate 406a respectively without passing through any logical stage. In other words, the arrangement of the conducting path 408 and the conducting path 406e can shorten the transmission time of the first reset signal Srst1 and the second reset signal Srst2 respectively. It is noted that another conducting path 410 is also arranged to directly connect between the data input terminal D of the first latching device 402 and the second data output terminal Q_bar of the second latching device 404 to shorten the transmission time of the output signal Fo' transmitted from the second data output terminal Q_bar of the second latching device 404 to the data input terminal D of the first latching device 402.

Figure 5:
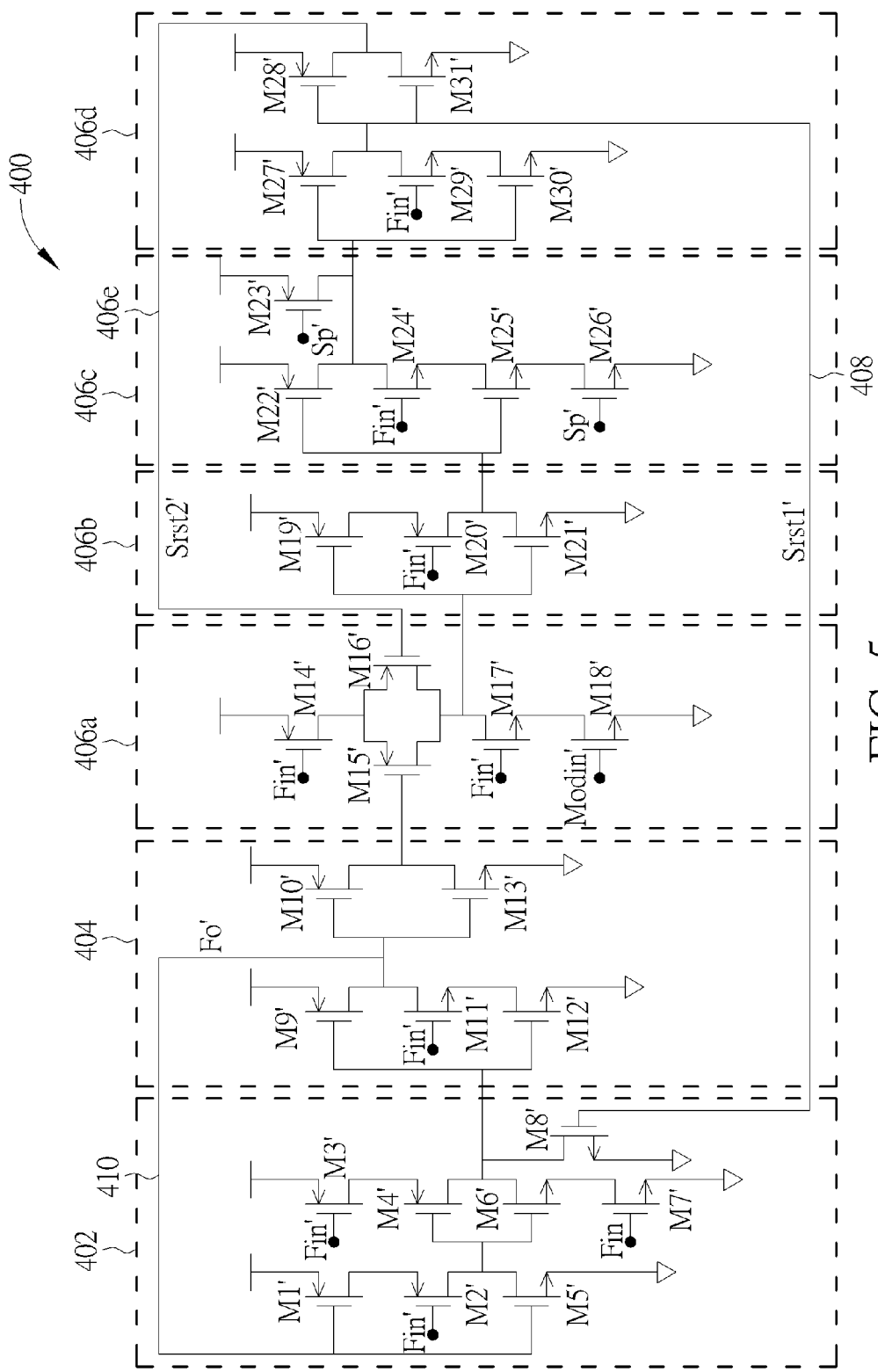
FIG. 5 is a schematic diagram illustrating a frequency dividing apparatus of FIG. 4 according to an embodiment of the present invention.

Please refer to FIG. 5, which is a schematic diagram illustrating the frequency dividing apparatus 400 according to an embodiment of the present invention. The frequency dividing apparatus 400 is a true single phase clock (TSPC) circuit. The first latching device 402 comprises four P-type transistors M1', M2', M3', M4', and four N-type transistors M5', M6', M7', M8'. The second latching device 404 comprises two P-type transistors M9', M10', and three N-type transistors M11', M12', M13'. The first AND gate 406a comprises three P-type transistors M14', M15', M16', and two N-type transistors M17', M18'. The third latching device 406b comprises two P-type transistors M19', M20', and one N-type transistor M21'. The second AND gate 406c comprises two P-type transistors M22', M23', and three N-type transistors M24', M25', M26'. The fourth latching device 406d comprises two P-type transistor M27', M28', and three N-type transistors M29', M30', M31'. It is noted that the connectivity of the circuit elements in the frequency dividing apparatus 400 is shown in FIG. 5, thus the detailed description is omitted here for brevity.

In comparison with the frequency dividing apparatus 100 as shown in FIG. 3, the frequency dividing apparatus 400 further comprises the P-type transistors M16', M28', the N-type transistor M31, and the conducting path 406e, in which the P-type transistor M28' in combination with the N-type transistor M31 are arranged to generate the second reset signal Srst2' according to the first reset signal Srst1', the conducting path 406e is arranged to transmit the second reset signal Srst2', and the P-type transistor M16' is arranged to reset the first AND gate 406a.

Figure 6:
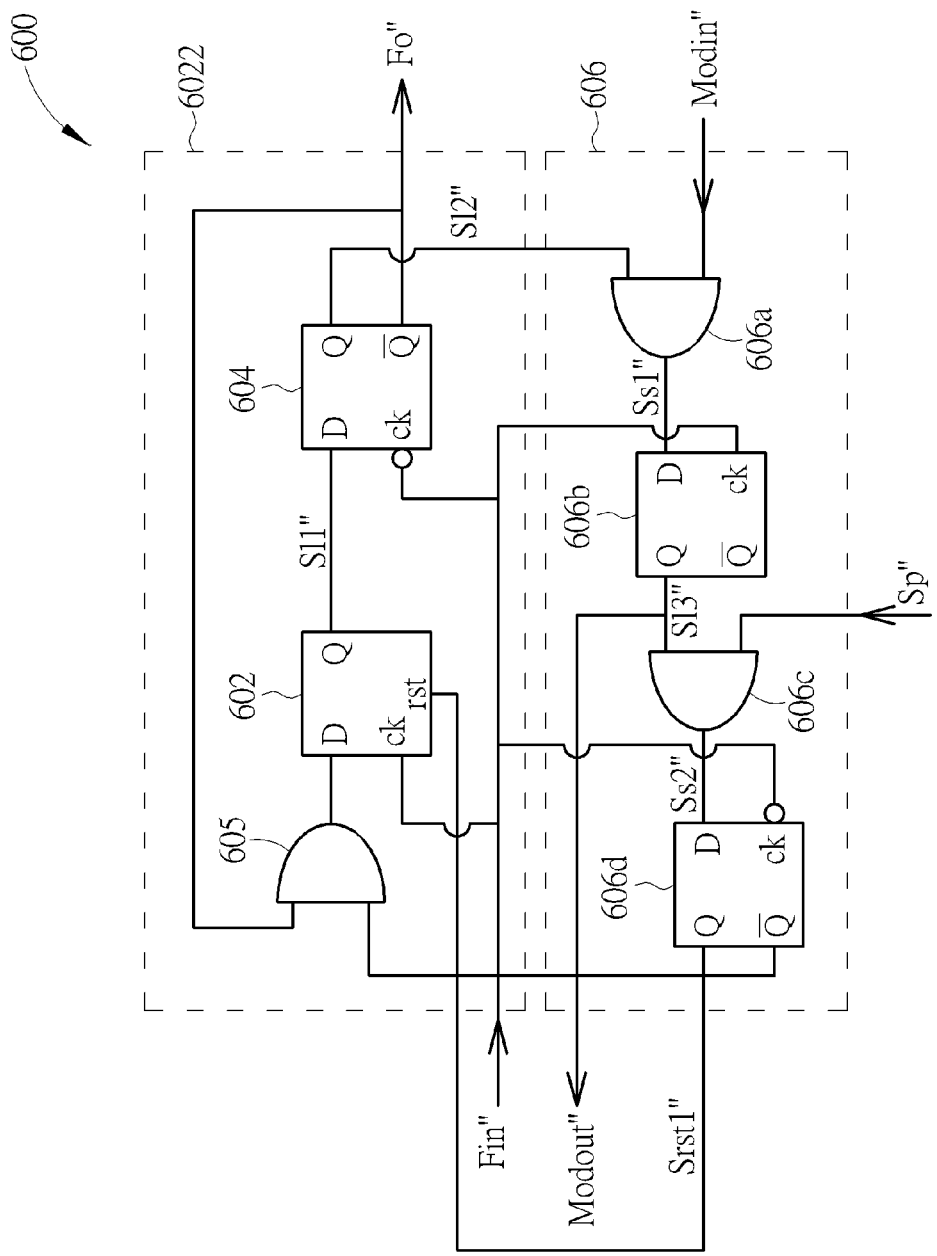
FIG. 6 is a diagram illustrating a frequency dividing apparatus according to a third embodiment of the present invention.

Please refer to FIG. 6, which is a diagram illustrating a frequency dividing apparatus 600 according to a third embodiment of the present invention. The frequency dividing apparatus 600 may be a dual-modulus prescaler. The frequency dividing apparatus 600 comprises a plurality of latching devices, i.e. a first latching device 602 and a second latching device 604, and an AND gate 605, arranged to selectively generate an output signal Fo" having a first oscillating frequency f1" or a second oscillating frequency f2" different from the first oscillating frequency f1" according to an input clock signal Fin" and a first reset signal Srst1". The first latching device 602 in combination with the second latching device 604 and the AND gate 605 can be regarded as a prescaler logic 6022. The controlling device 606 is arranged to generate the first reset signal Srst1" according to a programming input signal Sp", the input clock signal Fin", a mode control signal Modin", and the output signal Fo". Similar to the first embodiment, the frequency dividing apparatus 400 has two divisors, one divisor is two and the other divisor is three.

According to this embodiment, the first reset signal Srst1" is arranged to reset the first latching device 102" to make the prescaler logic 6022 to generate the output signal Fo" having the second oscillating frequency f2". Similar to the first embodiment, when the first reset signal Srst1" is a high voltage level Vdd", the first reset signal Srst1" resets the first latching device 602 to make the prescaler logic 6022 to divide the input clock signal Fin" by three. When the first reset signal Srst1" is a low voltage level Vgnd", the first reset signal Srst1" does not reset the first latching device 602 to make the prescaler logic 6022 to divide the input clock signal Fin" by two.

The controlling device 606 also comprises a first AND gate 606a, a third latching device 606b, a second AND gate 606c, and a fourth latching device 606d. The controlling device 606 is similar to the controlling device 106 of the frequency dividing apparatus 100. Therefore, the detailed description of the controlling device 606 is omitted here for brevity.

For the prescaler logic 6022, the prescaler logic 6022 further comprises the AND gate 605, in which the AND gate 605 has a first input terminal coupled to the second output terminal Q_bar of the second latching device 604 for receiving the output signal Fo", a second input terminal coupled to the second output terminal Q_bar of the fourth latching device 606d, and an output terminal coupled to the data input terminal D of the first latching device 602.

The conducting path 608 is arranged to directly connect between the reset terminal rst of the first latching device 602 and the first data output terminal Q of the fourth latching device 606d for conducting the first reset signal Srst1" to the first latching device 602. Therefore, once the first reset signal Srst1" is generated, the first reset signal Srst1" can immediately reset the first latching device 602 without passing through any logical stage. In other words, the arrangement of the conducting path 608 can shorten the transmission time of the first reset signal Srst1".

Please refer to FIG. 7, which is a schematic diagram illustrating the frequency dividing apparatus 600 according to an embodiment of the present invention. The frequency dividing apparatus 600 is a true single phase clock (TSPC) circuit. The AND gate 605 comprises three P-type transistors M1", M2", M3", and two N-type transistors M4", M5". The first latching device 602 comprises two P-type transistors M6", M7", and three N-type transistors M8", M9", M10". The second latching device 604 comprises two P-type transistors M11", M12", and three N-type transistors M13", M14", M15". The first AND gate 606a comprises two P-type transistors M16", M17", and two N-type transistors M18", M19". The third latching device 606b comprises two P-type transistors M20", M21", and one N-type transistor M22". The second AND gate 606c comprises two P-type transistors M23", M24", and three N-type transistors M25", M26", M27". The fourth latching device 606d comprises two P-type transistors M28", M29", and three N-type transistors M30", M31", M32". It is noted that the connectivity of the circuit elements in the frequency dividing apparatus 600 is shown in FIG. 7, thus the detailed description is omitted here for brevity.

In comparison with the frequency dividing apparatus 100 as shown in FIG. 3, the frequency dividing apparatus 400 further comprises the AND gate 605, i.e. the three P-type transistors M1", M2", M3", and the two N-type transistors M4", M5". The AND gate 605 in combination with the conducting path 610 is utilized to save certain DC (Direct current) current, and the delay introduced by the AND gate 605 in combination with the conducting path 610 is not critical.

Figure 8:
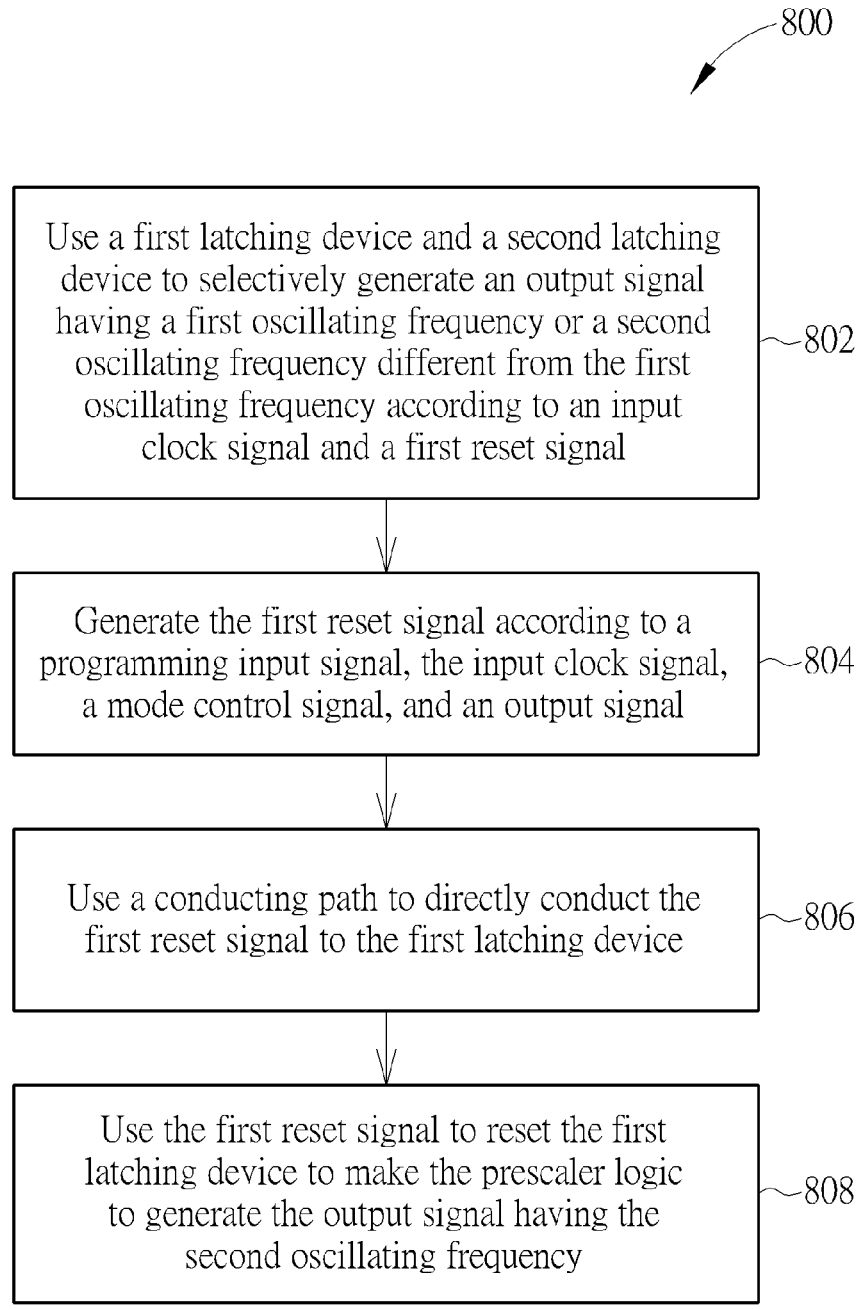
FIG. 8 is a flowchart illustrating a frequency dividing method according to an embodiment of the present invention.

In summary, the procedure of implementing the above embodiments can be summarized into the process in FIG. 8, which is a flowchart illustrating a frequency dividing method 800 according to an embodiment of the present invention. The frequency dividing method 800 is described in accordance with the frequency dividing apparatus 100, and this is not a limitation of the present invention. Provided that substantially the same result is achieved, the steps of the flowchart shown in FIG. 8 need not be in the exact order shown and need not be contiguous, that is, other steps can be intermediate. The frequency dividing method 800 comprises:

Step 802: Use the first latching device 102 and the second latching device 104 to selectively generate the output signal Fo having the first oscillating frequency f1 or the second oscillating frequency f2 different from the first oscillating frequency f1 according to the input clock signal Fin and the first reset signal Srst1;

Step 804: Generate the first reset signal Srst1 according to the programming input signal Sp, the input clock signal Fin, the mode control signal Modin, and the output signal Fo;

Step 806: Use the conducting path 108 to directly conduct the first reset signal Srst1 to the first latching device 102; and Step 808: Use the first reset signal Srst1 to reset the first latching device 102 to make the prescaler logic 1022 to generate the output signal Fo' having the second oscillating frequency f2.

Briefly, according to the above embodiments, a conducting path is arranged to directly transmit a reset signal to the prescaler logic in order to timely reset the first latching device (e.g. 102) of the prescaler logic when the prescaler logic needs to divide the input clock signal by three. Therefore, the prescaler logic may correctly divide the high frequency input clock in dual modes (e.g. the divisor of 2 or 3) under the low supply voltage and high frequency environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency dividing apparatus, comprising:
   a plurality of latching devices, arranged to selectively generate an output signal having a first oscillating frequency or a second oscillating frequency different from the first oscillating frequency according to an input clock signal and a first reset signal; and
   a controlling device, arranged to generate the first reset signal at least according to a programming input signal;
   wherein the first reset signal is arranged to reset a first latching device in the plurality of latching devices to make the plurality of latching devices to generate the output signal having the second oscillating frequency.

2. The frequency dividing apparatus of claim 1, wherein input clock signal has a third oscillating frequency, the first oscillating frequency is substantially a half of the third oscillating frequency, and the second oscillating frequency is substantially a third of the third oscillating frequency.

3. The frequency dividing apparatus of claim 1, further comprising:
   a conducting path, directly connected between the first latching device and the controlling device for conducting the first reset signal from the controlling device to the first latching device.

4. The frequency dividing apparatus of claim 1, wherein the controlling device generates the first reset signal further according to a mode control signal and the output signal.

5. The frequency dividing apparatus of claim 1, wherein a second reset signal is arranged to reset the controlling device, and the second reset signal is an inverse signal of the first reset signal.

6. The frequency dividing apparatus of claim 5, further comprising:
   a conducting path, directly connected between an output terminal of the controlling device and an input terminal of the controlling device for conducting the second reset signal from the output terminal to the input terminal.

7. The frequency dividing apparatus of claim 1, wherein the plurality of latching devices comprises:
   the first latching device, having a clock terminal receiving the input clock signal, a reset terminal receiving the first reset signal, a data input terminal receiving the output signal, and a data output terminal outputting a first latching signal; and
   a second latching device, having a clock terminal receiving an inverse input clock signal of the input clock signal, a data input terminal receiving the first latching signal, a first data output terminal outputting a second latching signal, and a second data output terminal outputting the output signal.

8. The frequency dividing apparatus of claim 7, wherein the first reset signal resets the first latching device to make the first latching signal kept intact for substantially one period of the input clock signal.

9. The frequency dividing apparatus of claim 7, wherein the controlling device comprises:
   a first AND gate, having a first input terminal receiving the second latching signal, a second input terminal receiving a mode control signal, and an output terminal outputting a first logical signal;
   a third latching device, having a clock terminal receiving the input clock signal, a data input terminal receiving the first logical signal, and a first data output terminal outputting a third latching signal;
   a second AND gate, having a first input terminal receiving the third latching signal, a second input terminal receiving the programming input signal, and an output terminal outputting a second logical signal; and
   a fourth latching device, having a clock terminal receiving the inverse input clock signal of the input clock signal, a data input terminal receiving the second logical signal, and a first data output terminal outputting the first reset signal.

10. The frequency dividing apparatus of claim 9, further comprising:
    a conducting path, directly connected between the reset terminal of the first latching device and the first data output terminal of the fourth latching device for conducting the first reset signal to the first latching device.

11. The frequency dividing apparatus of claim 9, wherein the fourth latching device further comprises a second data output terminal for outputting a second reset signal, the second reset signal is an inverse signal of the first reset signal, and the second reset signal is arranged to reset the first AND gate to make the plurality of latching devices generate the output signal having the first oscillating frequency.

12. The frequency dividing apparatus of claim 11, further comprising:
    a conducting path, directly connected between the second data output terminal of the fourth latching device and a third input terminal of the first AND gate for conducting the second reset signal to the first AND gate.

13. A frequency dividing method, comprising:
    using a plurality of latching devices to selectively generate an output signal having a first oscillating frequency or a second oscillating frequency different from the first oscillating frequency according to an input clock signal and a first reset signal;
    generating the first reset signal at least according to a programming input signal; and
    using the first reset signal to reset a first latching device in the plurality of latching devices to make the plurality of latching devices to generate the output signal having the second oscillating frequency.

14. The frequency dividing method of claim 13, wherein input clock signal has a third oscillating frequency, the first oscillating frequency is substantially a half of the third oscillating frequency, and the second oscillating frequency is substantially a third of the third oscillating frequency.

15. The frequency dividing method of claim 13, further comprising:
    using a conducting path to directly conduct the first reset signal to the first latching device.

16. The frequency dividing method of claim 13, wherein the first reset signal is generated further according to a mode control signal and the output signal.

* * * * *